US011519595B2

(12) United States Patent
Stassar et al.

(10) Patent No.: US 11,519,595 B2
(45) Date of Patent: Dec. 6, 2022

(54) LIGHTING ASSEMBLY WITH IMPROVED THERMAL BEHAVIOUR

(71) Applicant: LUMILEDS LLC, San Jose, CA (US)

(72) Inventors: Emanuel Stassar, Sprang Capelle (NL); Frans Hubert Konijn, Huizen (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/625,274

(22) PCT Filed: Jun. 13, 2018

(86) PCT No.: PCT/EP2018/065616
§ 371 (c)(1),
(2) Date: Dec. 20, 2019

(87) PCT Pub. No.: WO2018/234113
PCT Pub. Date: Dec. 27, 2018

(65) Prior Publication Data
US 2020/0217494 A1 Jul. 9, 2020

(30) Foreign Application Priority Data
Jun. 21, 2017 (EP) ..................................... 17177158

(51) Int. Cl.
*F21V 29/70* (2015.01)
*F21V 23/00* (2015.01)
(Continued)

(52) U.S. Cl.
CPC ............ *F21V 29/70* (2015.01); *F21V 23/005* (2013.01); *F21V 23/06* (2013.01); *F21Y 2115/10* (2016.08)

(58) Field of Classification Search
CPC ...... F21V 23/001; F21V 23/005; F21V 29/70; F21V 23/06; H01L 2933/0033
(Continued)

(56) References Cited

U.S. PATENT DOCUMENTS 6,032,521 A * 3/2000 Miwa ........................ G01B 7/30
338/164
9,508,905 B2 11/2016 Lechleiter et al.
(Continued)

FOREIGN PATENT DOCUMENTS

EP 2551903 A2 1/2013
JP 2007-280714 A 10/2007
(Continued)

OTHER PUBLICATIONS

Japanese Office Action dated Jun. 28, 2022 for Japanese Patent Application No. 2019-570363.

*Primary Examiner* — Karabi Guharay
(74) *Attorney, Agent, or Firm* — Volpe Koenig (57) ABSTRACT

The invention describes a lighting assembly and a lighting device with improved thermal behavior and a method to manufacture such a lighting assembly comprising at least one point-like light source having a first and a second electrical contact, a lead frame having metal areas to electrically connect at least the first electrical contact and to spread heat from the point-like light sources via the metal areas, and a plastic layer arranged at least on top of the lead frame. One or more conductive traces are applied on a first surface of the plastic layer facing away from the lead frame to electrically insulate the conductive traces on the plastic layer from the metal areas of the lead frame. Additional components or the second electrical contact might be connected to the conductive traces.

19 Claims, 4 Drawing Sheets

(51) Int. Cl.
*F21V 23/06* (2006.01)
*F21Y 115/10* (2016.01)

(58) Field of Classification Search
USPC .......................................................... 362/294
See application file for complete search history.

(56) References Cited

U.S. PATENT DOCUMENTS

| | | | |
|---|---|---|---|
| 10,036,546 B2 | 7/2018 | Ito | |
| 2003/0189830 A1 | 10/2003 | Sugimoto et al. | |
| 2004/0065894 A1 | 4/2004 | Hashimoto et al. | |
| 2004/0099874 A1 | 5/2004 | Chang et al. | |
| 2007/0081340 A1* | 4/2007 | Chung | F21K 9/00 362/294 |
| 2007/0224809 A1* | 9/2007 | Yamano | H01L 21/76879 438/670 |
| 2015/0091432 A1* | 4/2015 | Tsuda | H01L 33/54 313/46 |
| 2015/0221840 A1 | 8/2015 | O'Brien | |
| 2016/0043294 A1 | 2/2016 | Palaniswamy et al. | |
| 2016/0381771 A1 | 12/2016 | Chen et al. | |
| 2017/0062678 A1* | 3/2017 | Butterworth | H01L 33/62 |

FOREIGN PATENT DOCUMENTS

| | | |
|---|---|---|
| JP | 2013-228423 A | 11/2013 |
| JP | 2017-004773 A | 1/2017 |

\* cited by examiner

LIGHTING ASSEMBLY WITH IMPROVED THERMAL BEHAVIOUR

FIELD OF THE INVENTION

The invention relates to a lighting assembly with improved thermal behavior, to a lighting device comprising such lighting assembly and to a method to manufacture such a lighting assembly.

BACKGROUND OF THE INVENTION

Light-emitting devices (LEDs) as an example for point-like light sources have many advantages over incandescent light sources, including lower energy consumption, longer lifetime, improved physical robustness, smaller size, and faster switching. LEDs are used in applications as diverse as aviation lighting, automotive, advertising, general lighting, traffic signals, camera flashes, lighted wallpaper etc. In order to provide more functionality to lightings devices comprising e.g. LEDs, additional electrical components are arranged on the same LED package requiring separate additional conductive traces to connect the additional components to a power source. When keeping the LED package the same size, these traces will occupy valuable metal area, which cannot be used any more for spreading heat away from the LED. The thermal management of the LED relies heavily on this available metal area to spread the heat and conduct it away from the LED.

When dealing with lighting assemblies comprising LEDs and additional components, the so-called molded interconnect device (MID) technology can be used to provide a substrate comprising a structure wiring to separately connect additional components and the LEDs on the same lead frame. With MID technology, a plastic substrate will be plated with a thin metal layer, where the metal layer is removed from the substrate at the locations, where no conductive traces are desired. The remaining conductive traces can be used to contact all components of the lighting assembly including the LED. The disadvantage of the MID-prepared substrates is the very poor thermal conductivity of the used plastic making it useless for high power LEDs.

In case of desired small sized lighting assemblies carrying multiple components, multilayer boards might be used adding more functional dielectric layers to provide complex routing of conductive traces in a very limited volume. The severe disadvantage of multilayer boards is its bad thermal performance, which become even worse with each additional layer of dielectric material.

Lighting assembly only providing a low or medium heat spread away from the LED(s) either only allow the application of low power LEDs and/or lead to a reduced lifetime of the used LEDs.

Consequently, there is a need for lighting assemblies having an improved thermal management to spread heat away from the used LED to be able to operate high irradiance LEDs with a long lifetime. It is further desirable, that this lighting assembly can be manufactured with low effort.

SUMMARY OF THE INVENTION

It is an object of the present invention to provide a lighting assembly for point-like light sources providing an improved thermal behavior, which also can be manufacture with a low production effort.

The invention is defined by the independent claims. The dependent claims define advantageous embodiments.

According to a first aspect a lighting module is provided. The lighting assembly comprises at least one point-like light source having a first and a second electrical contact, a lead frame comprising suitable metal areas to electrically connect at least the first electrical contact of the at least one point-like light source to a power source and to spread heat from the at least one point-like light source via the metal areas, and a suitably shaped plastic layer arranged at least on top of the lead frame, where one or more conductive traces are applied on a surface of the plastic layer facing away from the lead frame to electrically insulate the conductive traces on the plastic layer from the metal areas of the lead frame to be able to electrically connect additional components on top of the plastic layer separately from the lead frame or to connect the second electrical contact of the at least one point-like light source with one of the conductive traces being connected to the power source. In an embodiment the plastic layer might be arranged around the lead frame.

The term "point-like light source" denotes any light source, which has a small light emission area (or volume). Such point-like light sources may be LEDs or semiconductor lasers, e.g. quantum wells or dots. The lighting assembly may comprise an array of point-like light sources, e.g. an LED array. The array of point-like light sources may comprise multiple columns and multiple rows of point-like light sources. The number of point-like light sources arranged in the rows and/or columns depends on the particular application of the lighting assembly. The backside of the point-like light sources comprises at least a first electrical contact. In one embodiment the second electrical contact is also arranged on the backside of the point-like light source. In another embodiment the second electrical contact is arranged on other sides of the point-like light source, not on the backside. Here the second electrical contact might be arranged on the front side of the point-like light source (opposite to the backside). At least the first electrical contact shall be adapted to be contacted to the lead frame (e.g. on the lead frame directly or on vias), where the backside might be structured to provide separate contact pads for electrically connecting the point-like light sources. LEDs are solid state light source typically small (less than 1 mm$^2$) and available e.g. ranging from IR to visible and ultraviolet wavelengths with very high brightness. LEDs have many advantages over incandescent light sources including lower energy consumption, longer lifetime, improved physical robustness, smaller size, and faster switching.

The term "lead frame" denotes metal structures (or metal areas) provided on or inside a substrate, e.g. a chip package, that carry signals from the specific connected component (here the point-like light source) to the outside. The connected component might be glued or soldered to the lead frame. The metal structures are suitably shaped to establish a conductive path between a power source and the connected components, here the point-like light source, and to spread heat from the point-like light source to the environment in order to keep the temperature of the point-like light source within a temperature range which does not reduce the lifetime of the point-like light source below a desired threshold. In order to improve the heat spreading, the metal areas are preferably shaped as large areas to provide a large surface for transferring heat to the environment. In order to maximize the available metal areas for heat spreading, preferably no other components are connected to the lead frame except the point-like light sources. A preferred material is Copper. Size and thickness of the metal areas are a tradeoff between cost and product dimension Additional electrically operated component denote any further component not being a point-like light source. Additional components might be NTCs, TVSs, resistors, ICs, FETs etc. The required power for these additional components is provided via separate conductive traces being not part of the lead frame but instead being provided on top of a plastic layer arranged between the lead frame and the conductive traces and the additional components. The plastic layer is suitably shaped in order to electrically insulate the conductive traces to connect the additional components and the additional components from the lead frame. The material of the plastic layer might be Epoxy, PPA, LCP, PA or any other suitable non-conductive material having a thickness of at least 30 μm. The conductive traces applied on a first surface of the plastic layer facing away from the lead frame might be any suitable material providing sufficient electrical contact between the additional components and external components like driver or power source. Preferably the conductive traces are made of metal, e.g. copper.

This invention improves the heat spread away from the point-like light source, because the lead frame mainly contains conductive paths to supply power to the point-like light sources. Therefore almost no other traces will occupy valuable metal area, which cannot be used any more for spreading heat away from the point-like light sources, e.g. LEDs. The thermal management of the lighting assembly is able to utilize almost all available metal areas of the lead frame to spread the heat and conduct it away from the point-like light sources. Additionally the lead frame is not arranged inside a multilayer board but on the backside of the stack of lead frame, plastic layer and additional conductive traces applied on top of the plastic layer and therefore avoids bad thermal performance of multilayer boards. For this purpose it has no effect, whether the second electrical contact of the point-like light source is connected to the lead frame or to the conductive traces on top of the plastic layer. Furthermore the provided conductive traces on top of the plastic layer in case of supplying the additional components do not have to spread heat from the point-like light sources, since the lead frame is able to sufficiently perform this transfer via the metal areas of the lead frame. Therefore the disadvantage of very poor thermal conductivity of conductive traces, for instance prepared by MID-technology, does not harm the thermal management of the point-like light sources.

Therefore the lighting assembly provides an improved thermal behavior and can be manufacture with a low production effort. Furthermore the improved thermal management enables to operate such lightings assemblies comprising high irradiance point-like light sources (e.g. high power LED) with a long lifetime.

The lighting assembly may be arranged in such a way that the plastic layer comprises at least one opening at a suitable position, where the at least one point-like light source shall be placed in order to enable to connect at least the first electrical contact of the at least one point-like light source to the lead frame. The opening provides access to a part of the metal areas of the lead frame in order to simply place the point-like light source onto the lead frame for establishing an electrical contact to the lead frame, at least for the first electrical contact. The opening enables easy contacting.

The lighting assembly may be arranged in such a way that the lead frame comprises a suitable number of solder pads to contact the first and/or second electrical contact of the at least one light source, where the at least one opening is arranged above the solder pads. A solder pad is a free accessible metal area large enough to apply a soldering process.

The lighting assembly may be arranged such that the at least one opening is a via at least partly filled with electrical conductive material and such that the first electrical contact of the at least one point-like light source placed on top of the plastic layer is in electrical contact with the lead frame by the via. Moreover, the recess is able to guide the placing of the point-like light source and is able to stabilize the position of the point-like light source during the contacting process, e.g. a soldering process.

The term "via" denotes a vertical interconnect access, which is an electrical connection between layers in an electronic circuit. In order not to decrease the thermal conductivity away from the point-like light source the via is provided with a sufficiently large cross section depending on the particular application of the lighting assembly. The use of vias enables to apply a more or less unstructured plastic layer on top of the lead frame, which makes the manufacturing process of the plastic layer more easily.

The lighting assembly may be arranged in such a way that material, shape and size of the via are adapted in order not to decrease the heat spread compared to the heat spread for point-like light source being directly connecting on top of the lead frame. The conductive material within the via may have a higher thermal conductivity compared to the conductive material used in the lead frame and/or the cross section of the via is large enough (suitable shape and size) not to decrease the heat spreading.

The lighting assembly may be arranged in such a way that the plastic layer is provided on top of the lead frame by overmolding the lead frame with plastic material as an insulating layer. Here the plastic layer can be applied onto the lead frame directly without requiring separate production steps for manufacturing and providing the plastic layer for later attachment to the lead frame. Especially the overmolding avoids additional logistic and manufacturing steps for providing the plastic layer with correct shape and size. Furthermore, a secure connection between lead frame and plastic layer is established.

The lighting assembly may be arranged in such a way that the conductive traces on the first surface of the plastic layer are provided by using MID technology. The MID technology comprises at least partial covering of the first surface of the plastic layer with a conductive layer often followed by partly removing the conductive layer, where no conductive traces shall be placed in order to provide the remaining conductive traces. Eventually the conductive traces are thickened by growing more conductive material on top of the present conductive material. A thicker conductive trace is more stable and provides a better electrical conductivity.

According to a second aspect a lighting device is provided. The lighting device comprises one or more lighting assemblies according to the present inventions and at least one driver connected to the lighting assemblies to drive the one or more lighting assemblies. A driver is used to operate the lighting assembly, especially the point-like light sources and the additional components. Eventually further optical elements are arranged within the light path of the light emitted from the point-like light sources. The term "optical element" denotes any element acting upon light passing through said element. The optical element is an at least partially transparent body suitably shaped to act upon the light in the desired way causing refraction, diffraction, reflection or blocking parts of the light beam passing the optical element. A collimator as an optical element narrows the light beam in a specific direction, e.g. focusing the light beam on a focus point having a focus distance to the collimator or optical element comprising the collimator.

Therefore the lighting device comprising one or more lighting assembly with an improved thermal behavior and can be manufacture with a low production effort. Furthermore the improved thermal management enables to operate such lightings devices comprising high irradiance point-like light sources (e.g. high power LED) with a long lifetime.

According to a third aspect a method to manufacture a lighting assembly with at least one point-like light source according to the present invention having a first and a second electrical contact is provided. The method comprises the steps of Providing a lead frame comprising suitable metal areas to electrically connected at least one point-like light source to a power source and to spread heat from the at least one point-like light source via the metal areas;

Arranging a suitable shaped plastic layer at least on top of the lead frame in order to electrically insulate the lead frame from a first surface of the plastic layer;

Providing conductive traces on the first surface of the plastic layer facing away from the lead frame;

Connecting at least the first electrical contact of the at least one point-like light source to the lead frame; and connecting an at least one additional component to the conductive traces on the first surface of the plastic layer separately from the lead frame and/or connecting the second electrical contact of the at least one point-like light source with one of the conductive traces being connected to the power source.

Therefore the method provides a lighting assembly with improved thermal behavior and how to manufacture the lighting assembly with a reduced effort. Furthermore the improved thermal management enables to operate such lightings assemblies comprising high irradiance point-like light sources (e.g. high power LED) with a long lifetime.

The method may be arranged in such a way that it further comprises the step of providing at least one opening in the plastic layer at a suitable position, where the at least one point-like light source shall be placed in order to connect at least the first electrical contact to the lead frame. As an example the point-like light source might be soldered onto the lead frame.

The method may be arranged in such a way that the opening is provided as recess or via.

The method may be arranged in such a way that the step of providing the plastic layer on top of the lead frame is performed by overmolding the lead frame with plastic material as the plastic layer. Here the plastic layer can be applied onto the lead frame directly without requiring separate production steps for manufacturing and providing the plastic layer for later attachment to the lead frame. Especially the overmolding avoids additional logistic and manufacturing steps for providing the plastic layer with correct shape and size. Furthermore a secure connection between lead frame and plastic layer is established.

The method may be arranged in such a way that the step of providing the conductive traces on the first surface of the plastic layer comprises the steps of:

Covering the first surface of the plastic layer with a conductive layer;

Partly removing the conductive layer, where no conductive traces shall be placed.

The method may be arranged in such a way that the step of growing more conductive material on top of the present conductive material to form thicker conductive traces. Therefore the MID technology can be applied to provide structured conductive traces to supply additional components with operating power.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

In the Figures, like numbers refer to like objects throughout. Objects in the Figs. are not necessarily drawn to scale.

DETAILED DESCRIPTION OF EMBODIMENTS

Various embodiments of the invention will now be described by means of the Figures.

Figure 1:
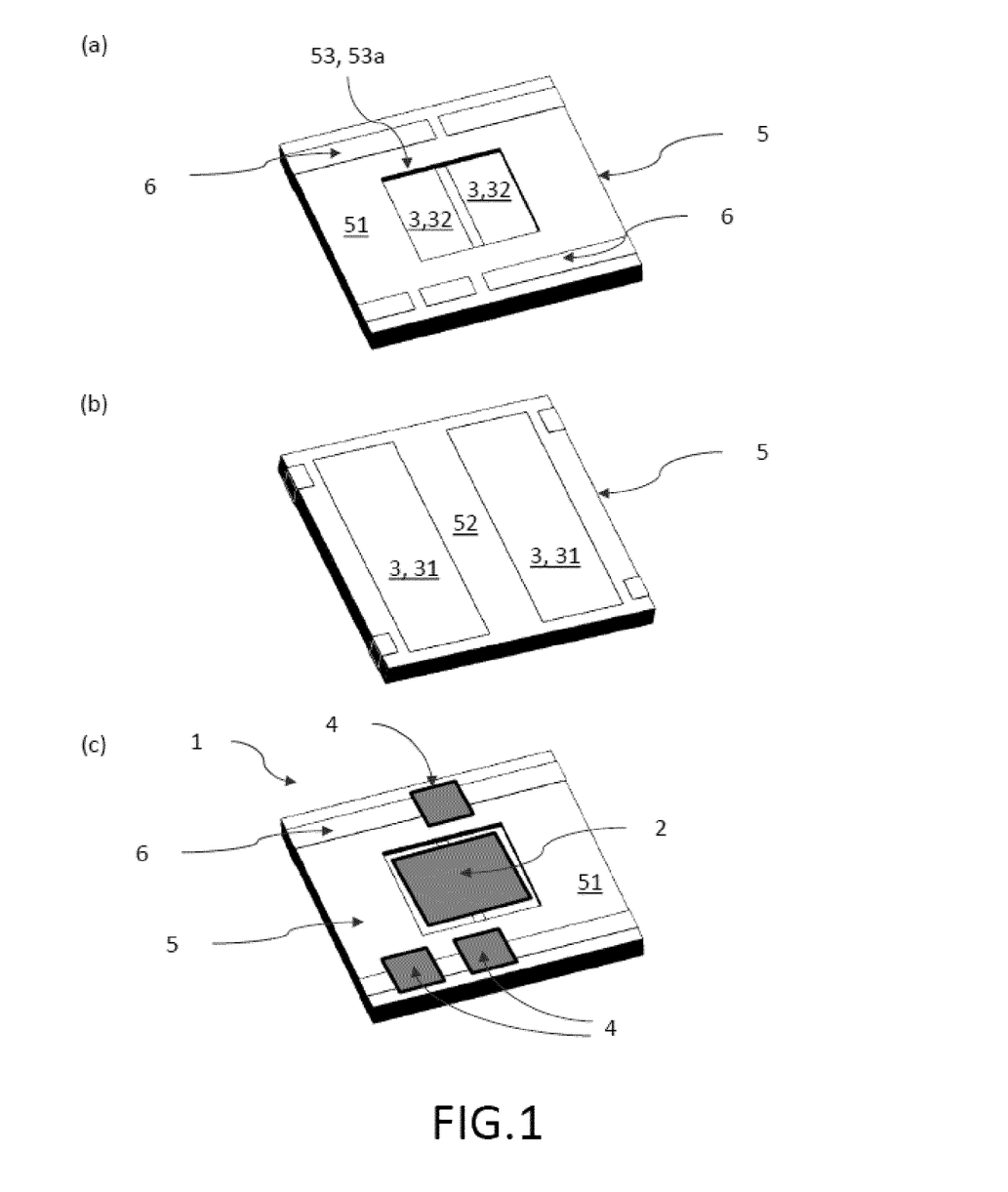
FIG. 1 shows a principle sketch of an embodiment the lighting assembly according to the present invention (a) in a perspective top view without the point-like light source, (b) in a perspective back view, and (c) in a top view with attached point-like light source in a recess and additional components.

FIG. 1 shows a principle sketch of an embodiment of the lighting assembly according to the present invention (a) in a perspective top view without the point-like light source, (b) in a perspective back view, and (c) in a top view with attached point-like light source in a recess and additional components. The lighting assembly 1 comprises a lead frame 3 comprising suitable metal areas 31, 32 to electrically connect a point-like light source 2 (see FIG. 1c) to the lead frame in order to connect it to a power source (not shown here) and to spread heat from the connected point-like light source 2 via the metal areas 31, which are not covered at the backside of the lighting assembly 1 for this purpose (see FIG. 1b). In order to comprise one or more additional electrically operated components 4 without disturbing the heat spreading function of the lead frame, especially the metal areas 31 of the lead frame, a suitably shaped plastic layer 5 is arranged between the lead frame 3 and the at least one additional component 4 to electrically insulate the lead frame 2 from the additional components 4. Here, the plastic layer 5 might be arranged on top or around the lead frame 2. This separation allows providing electrical power to the additional components 4 via conductive traces 6 applied on the first surface 51 of the plastic layer 5 facing away from the lead frame 3 without occupying areas of the lead frame 3 which can be used to spread heat from the point-like light source 2. The opposite surface 52 of the plastic layer 5 (lower surface 52) may face towards the first surface of the lead frame 3, or in this embodiment be part of the backside of the lighting assembly 1 beside the metal areas 31 (see FIG. 1b). As shown in FIGS. 1a and 1c the plastic layer 5 comprises one opening 53, where the point-like light source 2 can be placed in order to connect the point-like light source 2 to the lead frame 3. Here suitable metal areas as solder pads 32 extend into the area of the opening 53 for soldering the point-like light source 2 to the lead frame. In this embodiment the opening 53 is provided as a recess 53a (FIG. 1a) where the point-like light source 2 is being placed inside the recess 53a (FIG. 1c). As an example the plastic layer 5 is provided on top of the lead frame 3 by overmolding the lead frame 3 with suitable electrically insulating plastic material as the plastic layer 5. The conductive traces 6 on the first surface 51 of the plastic layer 5 might be provided by using MID technology. The material of these conductive traces 6 might be copper.

Figure 2:
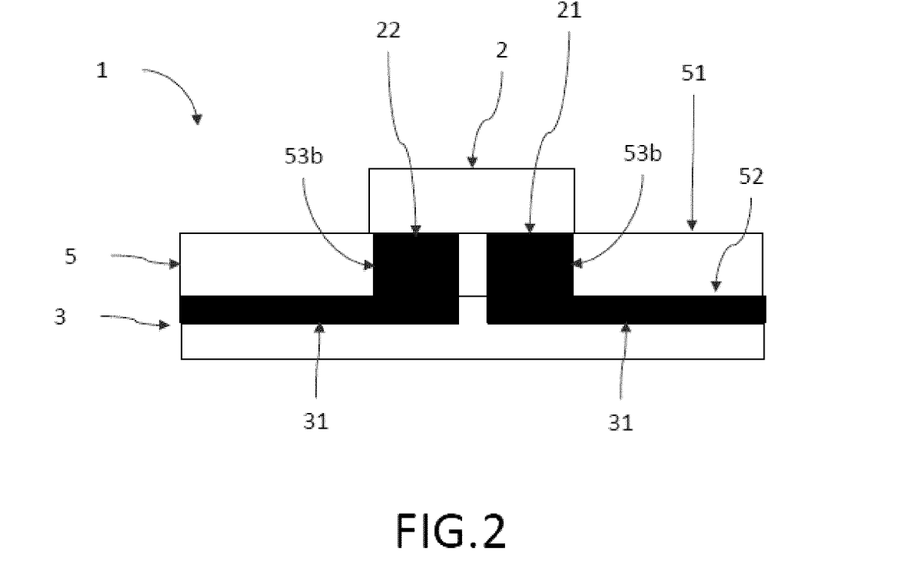
FIG. 2 shows another embodiment of the lighting assembly according to the present invention in a side view, where the point-like light source is connected by vias to the lead frame.

FIG. 2 shows another embodiment of the lighting assembly 1 according to the present invention in a side view, where the point-like light source 2 is connected by vias 53b to the lead frame 3. Here the opening 53 is used as a via 53b at least partly filled with electrical conductive material, where the point-like light source 2 is placed on top of the plastic layer 5 being electrically contact to the lead frame 3 by the vias 53b. Here material, shape and size of the via 53b are adapted in order not to decrease the heat spread compared to the heat spread for point-like light source 2 being directly connecting on top of the lead frame 3. The conductive material of the via 53b completely fills the volume above of each solder pad 32 as shown in FIG. 1a.

Figure 3:
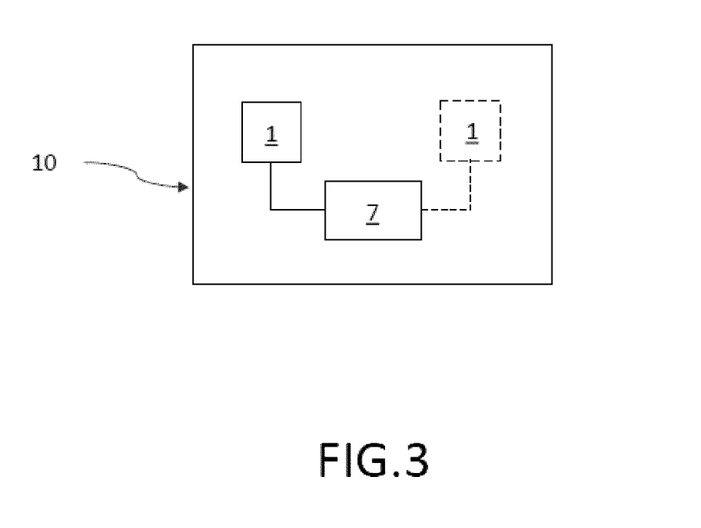
FIG. 3 shows a principle sketch of the lighting device according to the present invention comprising light assembly and driver.

FIG. 3 shows a principle sketch of the lighting device according to the present invention comprising two lighting assemblies 1 and driver 7. The driver 7 is connected to the lighting assemblies 1 to drive the two lighting assemblies 1. The connecting might be established by wires attached to the lead frames 3 of each lighting assembly 1 and the driver circuit.

Figure 4:
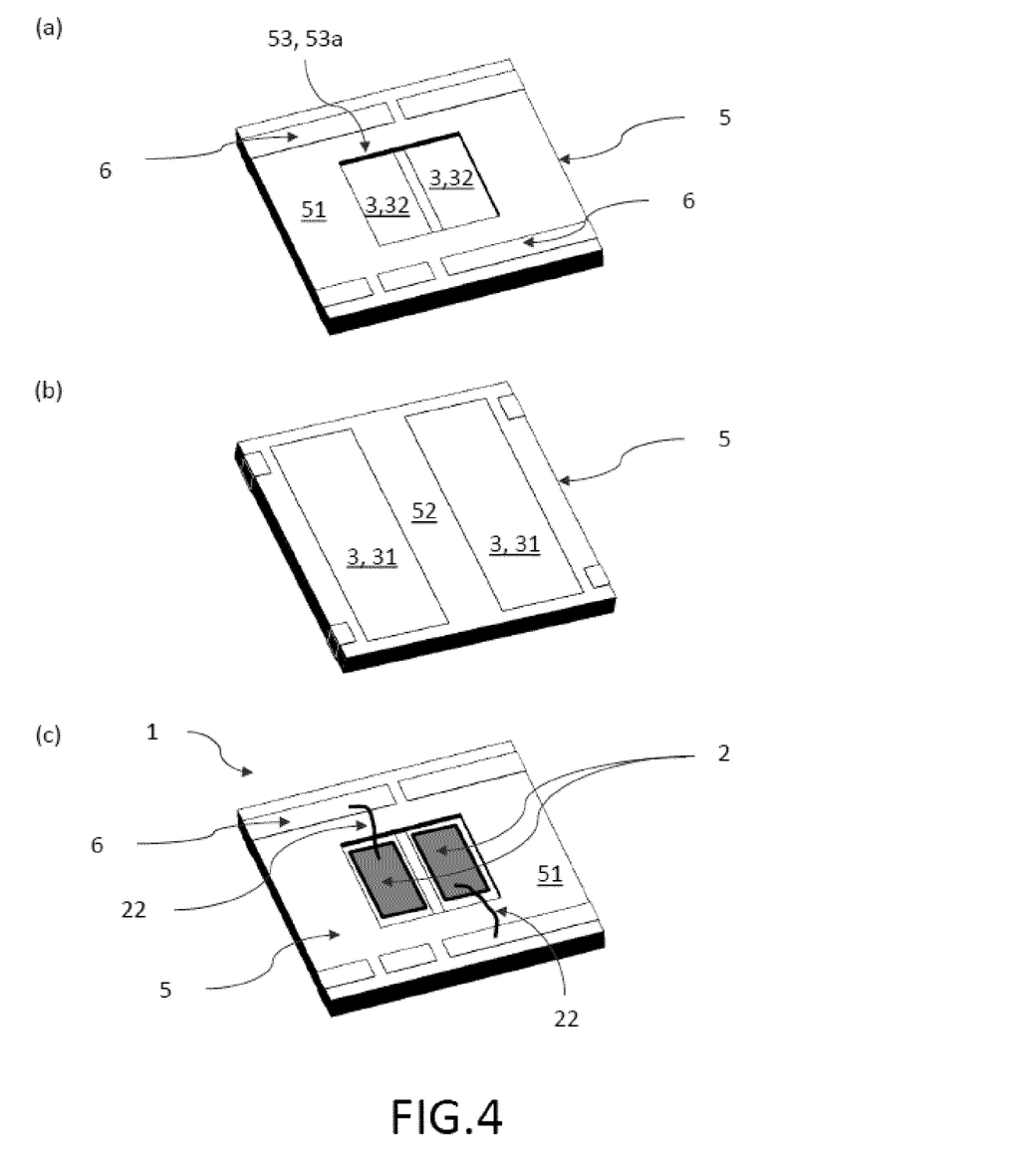
FIG. 4 shows a principle sketch of another embodiment the lighting assembly according to the present invention (a) in a perspective top view without the point-like light source, (b) in a perspective back view, and (c) in a top view with attached point-like light source in a recess, where the second electrical contact is connected to the conductive traces on top of the plastic layer.

FIG. 4 shows a principle sketch of another embodiment the lighting assembly (1) according to the present invention (a) in a perspective top view without the point-like light source (2), (b) in a perspective back view, and (c) in a top view with attached point-like light source (2) in a recess (53a), where the second electrical contact (22) is connected to the conductive traces (6) on top of the plastic layer (5). For FIGS. 4a and 4b we refer to the figure description of FIG. 1a, 1b. In FIG. 4c two point-like light sources 2 are placed into the opening 53 establishing a recess 53a. Here the two solder pads 32 within the opening 53 each carry one point-like light source 2, where the first contact 21 of each of the point-like light sources 2 (not shown here) are electrically connected to the metal areas (solder pads) of the lead frame 2 by soldering. In order to operate both point-like light sources 2, the second electrical contact 22 of each of the point-like light sources 2 is established by a wire and being connected to one of the conductive traces 6 each, which are connected to the power source also being connected to the first electrical contacts 21 of the point-like light sources 2 (not shown in particular).

Figure 5:
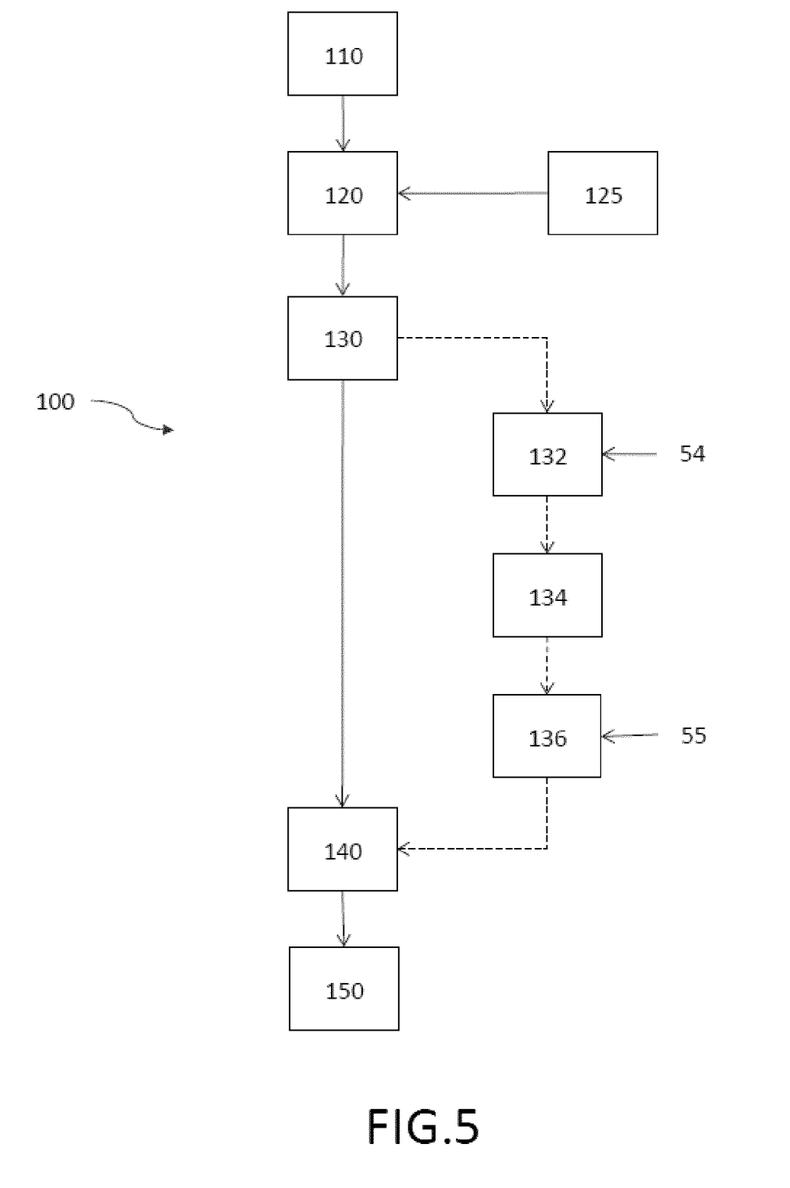
FIG. 5 shows an embodiment of a method to manufacture the lighting assembly according to the present invention.

FIG. 5 shows an embodiment of a method to manufacture the lighting assembly 1 according to the present invention with at least one point-like light source 2 having a first and a second electrical contact 21, 22. The method comprising the steps of providing 110 a lead frame 3 comprising suitable metal areas 31 to electrically connected at least one point-like light source 2 to a power source and to spread heat from the at least one point-like light source 2 via the metal areas 31 and arranging 120 a suitable shaped plastic layer 5 on top of the lead frame 3 in order to electrically insulate the lead frame 3 from electrically operated additional components 4 to be arranged on top of the plastic layer 5, where at least one opening 53 is provided 125 in the plastic layer 5 at a suitable position, where the at least one point-like light source 2 shall be placed in order to enable connecting the at least one point-like light source 2 to the lead frame 3, preferably by soldering. These step are followed by providing 130 conductive traces 6 on the first surface 51 of the plastic layer 5 facing away from the lead frame 3 and connecting 140 at least the first electrical contact 21 of the at least one point-like light source 2 to the lead frame 3 and connecting 150 an at least one additional component 4 to the conductive traces 6 on the first surface 51 of the plastic layer 5 separately from the lead frame 3 and/or connecting 150 the second electrical contact 22 of the at least one point-like light source 2 with one of the conductive traces 6 being connected to the power source. The opening 53 might be provided as recess 53a or via 53b. The step of providing 120 the plastic layer 5 on top of the lead frame 3 might be performed by overmolding the lead frame 3 with plastic material as the plastic layer 5. The step of providing 130 the conductive traces 6 on the first surface 51 of the plastic layer 5 may be executed by MID technology comprising the steps of covering 132 the first surface 51 of the plastic layer 5 with a conductive layer 54 and partly removing 134 the conductive layer 54, where no conductive traces 6 shall be placed. The removal step 134 might be executed by laser ablation of the non-desired parts of the previously applied conductive layer 54. Preferably the providing step 130 further comprises the step of growing 136 more conductive material 55 on top of the present conductive material 54 to form thicker conductive traces 6. This material might be grown by so-called electro less plating of the first thin copper layer as the conductive trace, where for example one can use the same process for further growth or one can use electro plating for further growth, which is a faster process and is giving better surface areas.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS

1 Lighting assembly according to the present invention
2 Point-like light source, e.g. LED
21 first electrical contact of the point-like light source 22 second electrical contact of the point-like light source
3 Lead frame
31 Metal areas of the lead frame
32 solder pad
4 additional electrically operated component
5 plastic layer
51 first surface of the plastic layer
52 lower surface of the plastic layer (facing towards the lead frame)
53 opening within the plastic layer
53a opening as a recess
53b opening as a via
54 conductive layer on top of the plastic layer
55 more conductive material grown on top of the present conductive material 54
6 conductive traces
7 driver
10 Lightings device according to the present invention
100 Method to manufacture the lighting assembly according to the present invention
110 Providing a lead frame
120 Providing a suitable shaped plastic layer on top of the lead frame
125 providing at least one opening in the plastic layer
130 Providing conductive traces on an first surface of the plastic layer
132 Covering the first surface of the plastic layer with a conductive layer
134 Partly removing the conductive layer, where no conductive traces shall be placed
136 growing more conductive material on top of the present conductive material
140 Connecting the at least one point-like light sources to the lead frame
150 Connecting one or more additional components to the conductive traces and/or connecting the second electrical contact of the at least one point-like light source with one of the conductive traces being connected to the power source

The invention claimed is:

1. A lighting assembly comprising:
at least one point-like light source having a first and a second electrical contact;
a lead frame comprising a plurality of metal areas; and
a plastic layer at least on top of the lead frame, the plastic layer comprising vias above the metal areas that are each completely filled with electrical conductive material, the plurality of metal areas of the lead frame being exposed from the plastic layer such that a bottom surface of the plastic layer and a bottom surface of the metal areas forms a bottom-most surface of the lighting assembly,
the at least one point-like light source being disposed in direct contact with a first surface of the plastic layer facing away from the lead frame, in direct contact with the electrical conductive material in the vias, and in electrical contact and thermal contact with the plurality of metal areas of the lead frame through the vias; and
one or more conductive traces on the first surface of the plastic layer facing away from the lead frame and electrically insulated from the metal areas of the lead frame.

2. The lighting assembly in accordance with claim 1, wherein:
the at least one point-like light source is directed connected on top of the lead frame, and
a material, a shape and a size of the vias is adapted in order not to decrease the heat spread compared to the heat spread for the at least one point-like light source directly connected on top of the lead frame.

3. The lighting assembly in accordance with claim 1, wherein the plastic layer is an overmolded plastic material.

4. The lighting assembly in accordance with claim 1, wherein the one or more conductive traces on the first surface of the plastic layer are provided by using molded interconnect device (MID) technology.

5. The lighting assembly in accordance with claim 1, wherein the at least one point-like light source comprises two point-like light sources, each electrically coupled to one of the vias.

6. The lighting assembly in accordance with claim 1, wherein the at least one point-like light source comprises one or more light-emitting diode (LED) devices.

7. A lighting device comprising:
one or more lighting assemblies, each of the one or more lighting assemblies comprising:
a lead frame comprising a plurality of metal areas, and
a plastic layer at least on top of the lead frame, the plastic layer comprising vias above the metal areas that are each completely filled with electrical conductive material, the plurality of metal areas of the lead frame being exposed from the plastic layer such that a bottom surface of the plastic layer and a bottom surface of the metal areas form a bottom-most surface of the lighting assembly,
the at least one point-like light source being disposed in direct contact with a first surface of the plastic layer facing away from the lead frame, in direct contact with the electrical conductive material in the vias, and in electrical contact and thermal contact with the plurality of metal areas of the lead frame through the vias, and
one or more conductive traces on the first surface of the plastic layer facing away from the lead frame and electrically insulated from the metal areas of the lead frame; and
at least one driver connected to the one or more lighting assemblies.

8. The lighting device as claimed in claim 7, wherein the at least one point-like light source is directly connected on top of the lead frame, and a material, a shape and a size of the vias is adapted in order not to decrease the heat spread compared to the heat spread for the at least one point-like light source directly connected on top of the lead frame.

9. The lighting device as claimed in claim 7, wherein the plastic layer is an overmolded plastic material.

10. The lighting device in accordance with claim 7, wherein the one or more conductive traces on the first surface of the plastic layer are provided by using molded interconnect device (MID) technology.

11. The lighting device in accordance with claim 7, wherein the one or more lighting assemblies comprise two lighting assemblies electrically coupled to the driver.

12. The lighting device in accordance with claim 7, wherein the at least one point-like light source comprises two point-like light sources, each electrically coupled to one of the vias.

13. The lighting device in accordance with claim 7, wherein the at least one point-like light source comprises one or more light-emitting diode (LED) devices.

14. A method of manufacturing a lighting assembly comprising:

providing a lead frame comprising a plurality of metal areas;

arranging a plastic layer at least on top of the lead frame in order to electrically insulate the lead frame from a first surface of the plastic layer that faces away from the lead frame with the plurality of metal areas of the lead frame exposed from the plastic layer such that a bottom surface of the plastic layer and a bottom surface of the metal areas form a bottom-most surface of the lighting assembly;

providing vias in the plastic layer;

completely filling each of the vias with an electrical conductive material;

providing the at least one point-like light source in direct contact with the first surface of the plastic layer and in direct contact with the electrical conductive material in the vias;

electrically and thermally connecting first and second electrical contacts of the at least one point-like light source to the metal areas of the lead frame by the vias;

providing conductive traces on the first surface of the plastic layer facing away from the lead frame; and connecting at least one additional component to the conductive traces on the first surface of the plastic layer electrically insulated from the plurality of metal areas of the lead frame.

15. The method as claimed in claim 14, wherein the providing the plastic layer on top of the lead frame comprises overmolding the lead frame with a plastic material.

16. The method as claimed in claim 14, wherein the providing the conductive traces on the first surface of the plastic layer comprises:
   covering the first surface of the plastic layer with a conductive layer; and
   partly removing the conductive layer in regions where no conductive traces are to be placed.

17. The method as claimed in claim 16, further comprising growing more conductive material on top of the conductive material to form thicker conductive traces.

18. The method in accordance with claim 17, wherein the growing more conductive material comprises electro less plating the conductive traces.

19. The method in accordance with claim 16, wherein the partly removing the conductive layer comprises using laser ablation to remove the conductive layers in the regions where no conductive traces are to be placed.

* * * * *